United States Patent
Erickson et al.

(10) Patent No.: US 11,137,429 B2
(45) Date of Patent: Oct. 5, 2021

(54) FUNCTIONAL NOISE FLOOR ADJUSTMENT OF SIGNAL MEASUREMENT DEVICE

(71) Applicant: Keysight Technologies, Inc., Santa Rosa, CA (US)

(72) Inventors: Bruce A. Erickson, Santa Rosa, CA (US); Keith Koch, Windsor, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 338 days.

(21) Appl. No.: 16/367,494

(22) Filed: Mar. 28, 2019

(65) Prior Publication Data

US 2020/0309831 A1 Oct. 1, 2020

(51) Int. Cl.
*G01R 29/26* (2006.01)
*G01R 23/173* (2006.01)
*H04B 17/318* (2015.01)

(52) U.S. Cl.
CPC ........... *G01R 23/173* (2013.01); *G01R 29/26* (2013.01); *H04B 17/318* (2015.01)

(58) Field of Classification Search
CPC ..... G01R 23/173; G01R 29/26; H04B 17/318
See application file for complete search history.

(56) References Cited

U.S. PATENT DOCUMENTS

| 4,839,582 | A | 6/1989 | Fukaya et al. |
| 6,191,571 | B1 * | 2/2001 | Fukui ................. G01R 23/16 324/614 |
| 6,229,316 | B1 | 5/2001 | Fukui et al. |
| 2003/0146743 | A1 * | 8/2003 | Truesdale ............ G01R 23/145 324/76.33 |
| 2018/0152255 | A1 * | 5/2018 | Woehrle ............... H04B 17/318 |
| 2018/0364278 | A1 * | 12/2018 | Hagmann .............. G01Q 60/16 |

* cited by examiner

*Primary Examiner* — Jermele M Hollington
*Assistant Examiner* — Taqi R Nasir (57) ABSTRACT

A signal measurement device and method are provided for receiving an RF input signal using frequency sweeping. The method includes determining RMS power levels of a noise floor of the signal measurement device at respective frequencies from a start frequency to a stop frequency of a swept frequency range; determining values of resolution bandwidths corresponding to the frequencies, the values of the resolution bandwidths being inversely proportional to the RMS power levels of the noise floor at the respective frequencies; performing frequency sweeping from the start frequency to the stop frequency to receive the RF input signal at the signal measurement device; and implementing the determined values of the resolution bandwidths corresponding to the frequencies while performing the frequency sweeping. Implementing the determined values of the resolution bandwidths results in functional sensitivity of the signal measurement device being substantially constant over the swept frequency range, and provides faster sweep times.

20 Claims, 4 Drawing Sheets

FUNCTIONAL NOISE FLOOR ADJUSTMENT OF SIGNAL MEASUREMENT DEVICE

BACKGROUND

Figure 3A:
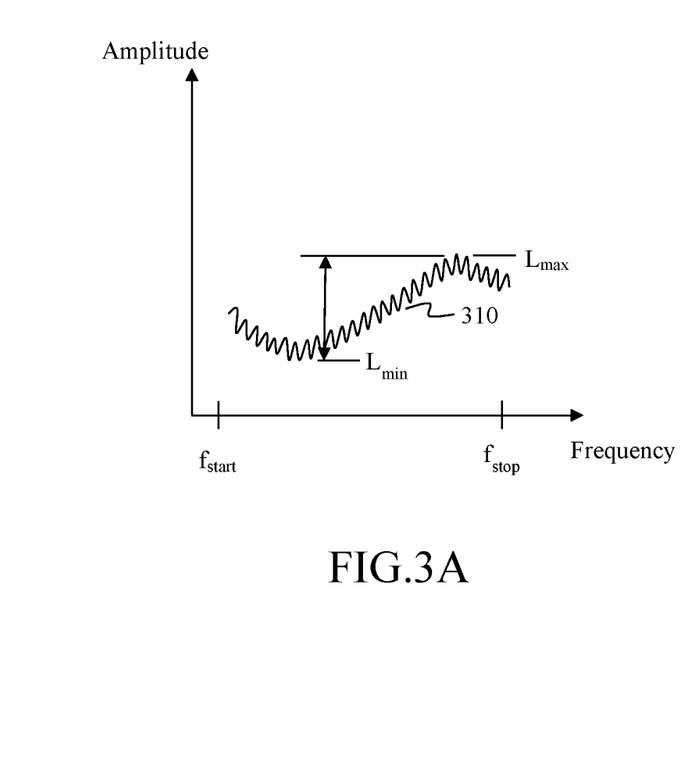
FIG. 3A is a graph showing an approximation of amplitude of noise floor versus frequency in a signal measurement device.
Figure 3B:
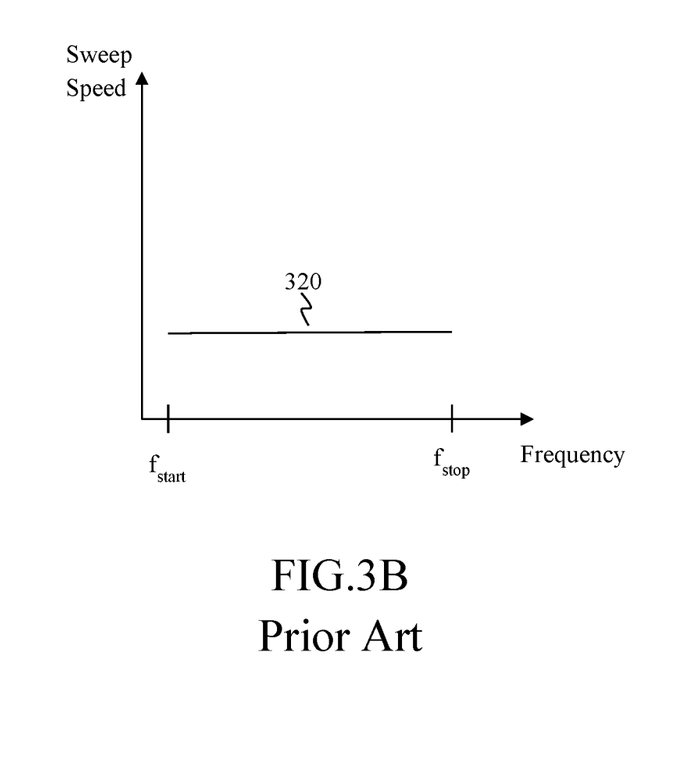
FIG. 3B is a graph showing an approximation of sweep speed versus frequency in a conventional signal measurement device.

Frequency sweeping is a technique for receiving a radio frequency (RF) input signal, for example, in which a tunable receiver (e.g., a spectrum analyzer) changes frequencies while receiving the RF input signal, from a minimum frequency to a maximum frequency (or vice versa) of a swept frequency range. The frequency sweeping is performed at a fixed sweep speed, as shown in FIG. 3B, of about 10 GHz/second, for example. Generally, fast sweeps across the swept frequency range enable quick identification and measurement of the RF input signals, and are therefore useful for performing high speed manufacturing processes and for quickly identifying transient signals, for example. However, hardware limitations of the receiver typically dictate the sweep speed, where the minimum time required to reset the receiver and high noise floor (low sensitivity) of the receiver tend to reduce the sweep speed through the frequencies in the swept frequency range.

Another factor that affects the sweep speed is resolution bandwidth (RBW) of the receiver, the value of which may be set by a user or automatically by the receiver. The RBW is a qualitative measure of separation required between adjacent frequency components in the RF input signal to enable visual separation of these frequency components in a display. The noise floor of the receiver is related to the RBW with a decibel (dB) proportionality of 10*Log(RBW). Thus, a narrow RBW (having a low RBW value) produces a lower noise floor (increased sensitivity) of the receiver and provides a higher resolution of the signal, and a wide RBW (having a high RBW value) produces a higher noise floor (decreased sensitivity) and provides a lower resolution of the signal, such that the noise floor of the receiver is directly proportional to the value of the RBW. With respect to sweep speed, a narrow RBW requires a slower sweep speed than a wide RBW value, since the sweep time must be slow enough to allow the RBW filter to settle, and the narrower RBW requires a longer settling time than a wider RBW. The sweep speed is proportional to the square of the value of the RBW. Due to these RBW effects, there is a tradeoff between receiver sensitivity and sweep speed.

Conventional receivers use a fixed RBW over the swept frequency range, where the fixed RBW is narrow enough so that the RF input signal is still detectable at frequencies corresponding to the highest noise floor. Since the RF input signal would still be detectable at other frequencies corresponding to lower noise floors using a wider RBW (which enables a faster sweep speed), the conventional fixed RBW results in an unnecessarily slow sweep speed at most frequencies in the swept frequency range. Conventional efforts to improve sweep speed involve improvements to hardware and associated complexity. Higher speed control of a local oscillator (LO) in the receiver and efforts to reduce noise generated in RF converter circuits may increase processing speed. However, such efforts may be complex and cost prohibitive to provide.

Accordingly, a signal measurement device and a corresponding method of operating the same are needed able to provide increased sweep time without degrading signal quality at frequencies where the receiver has a high noise floor (low sensitivity).

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a signal measurement device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Generally, according to various embodiments, a radio frequency (RF) input signal is received by a signal measurement device, such as a spectrum analyzer, for example, using frequency sweeping. Initially, sensitivity of the signal measurement device is determined for frequencies over a swept frequency range by identifying and storing the noise floor. For example, root mean square (RMS) power levels of the noise floor may be determined at respective frequencies from a start frequency to a stop frequency of the swept frequency range. Values of resolution bandwidths (RBWs) corresponding to these frequencies are determined for receiving the RF input signal, where the determined values of the RBWs are inversely proportional to the RMS power levels of the noise floor at the respective frequencies. That is, lower RBW values (narrow RBWs) are determined for higher RMS power levels to accommodate the higher noise floor, and vice versa. Frequency sweeping may then be performed from the start frequency to the stop frequency by the signal measurement device to receive the RF input signal. During the frequency sweeping, the determined values of the RBWs bandwidths corresponding to the frequencies are implemented, increasing the sweep speed (and decreasing sweep time) overall as compared to conventional frequency sweeping using a fixed sweep speed. Also, implementing the determined values of the RBWs results in functional sensitivity of the signal measurement device being substantially constant over the swept frequency range.

Figure 1:
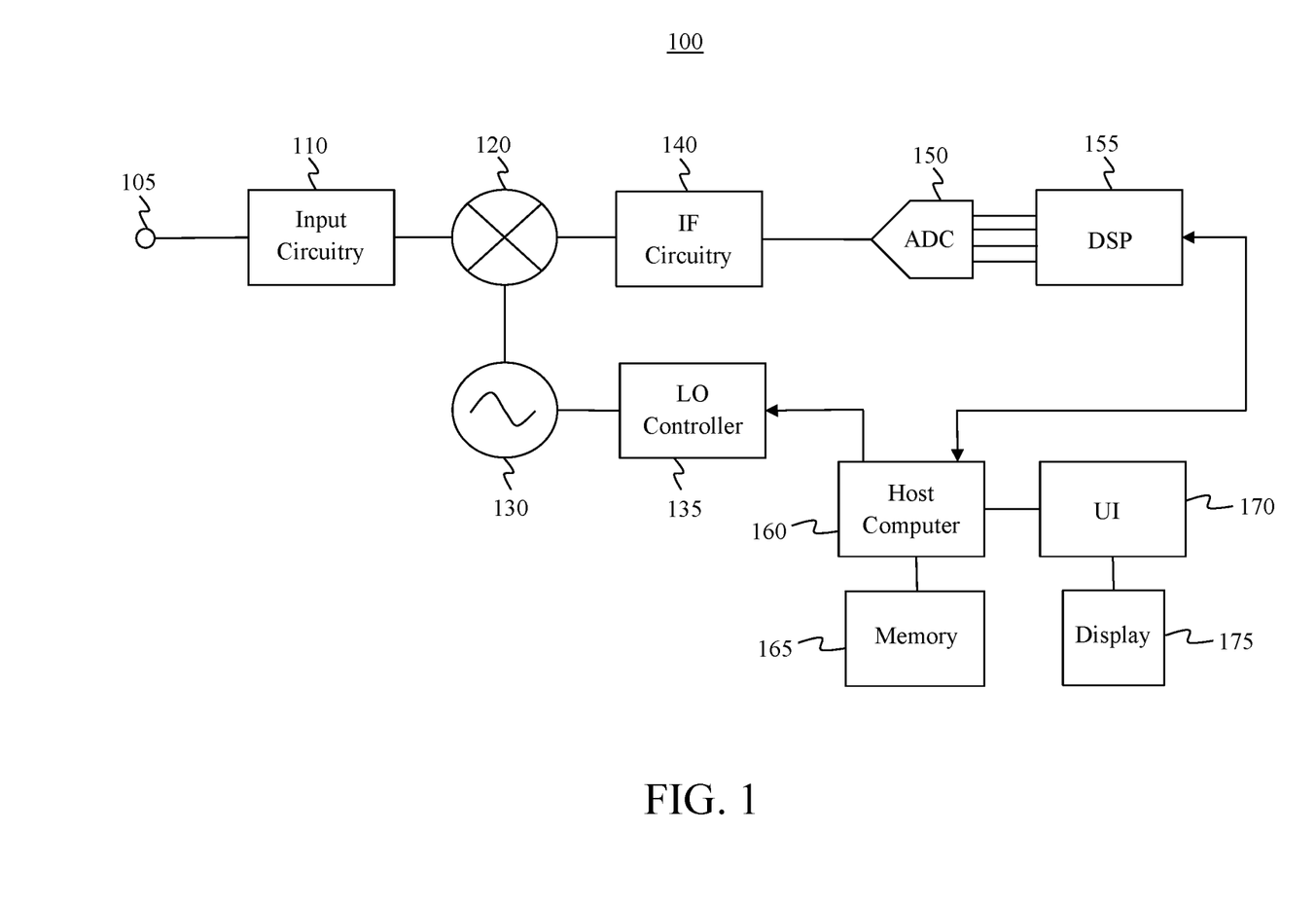
FIG. 1 is a simplified block diagram of a signal measurement device, according to a representative embodiment.

FIG. 1 is a simplified block diagram of a signal measurement device, according to a representative embodiment.

Referring to FIG. 1, the signal measurement device is an illustrative spectrum analyzer 100, although other types of signal measurement devices may be used without departing from the scope of the present teachings. In the depicted embodiment, the spectrum analyzer 100 includes test port 105, input circuitry 110, mixer 120, tunable local oscillator (LO) 130, intermediate frequency (IF) circuitry 140, and analog-to-digital converter (ADC) 150. The spectrum analyzer 100 further includes LO controller 135, digital signal processor (DSP) 155, host computer 160, memory (and/or database) 165, user interface (UI) 170 and display 175. Although the memory 165 is shown as a single illustrative block connected to the host computer 160, it is understood that the memory 165 may be implemented by one or more memories and/or databases, and may be accessible by the LO controller 135 and/or the DSP 155 as well as the host computer 160, without departing from the scope of the present teachings. Likewise, it is understood that the LO controller 135 and/or the DSP 155 may have dedicated memories, respectively. The test port 105 is configured to input RF input signals, for example, from a device under test (DUT) (not shown), to be processed, measured and/or displayed at the display 175. For example, the display 175 may show measured power (y-axis) versus swept frequency (x-axis) of an RF input signal, or provide data for external analysis and display. In embodiment, the user interface 170 and the display 175 provide a graphical user interface (GUI) for a user to interface with the spectrum analyzer 100.

The input circuitry 110 may include various known input circuits (not shown) for processing the RF input signals, including but not limited to an input attenuator and an RF filter, for example. The IF circuitry 140 may include various known IF circuits (not shown) for processing IF signals, output from the mixer 120, including but not limited to an IF amplifier and a band pass IF filter, for example. Architectures of input circuitry 110 and the IF circuitry 140 may vary to provide unique benefits for any particular situation or to meet application specific design requirements of various implementations, as would be apparent to one having ordinary skill in the art.

The LO 140 outputs an LO signal tuned to different LO frequencies, under control of the LO controller 135, which enables frequency sweeping of an RF input signal from a minimum or start frequency ($f_{start}$) to a maximum or stop frequency ($f_{stop}$) of a swept bandwidth or swept frequency range. The LO 140 may include a voltage controlled oscillator (VCO), for example, that generates LO frequencies in response to voltage levels controlled by the LO controller 135. The mixer 120 is configured to mix the RF input signal from the input circuitry 110 with the variable frequency LO signal form the LO 140 to provide an IF signal, which also has a variable frequency resulting from the variable LO frequency. The IF signal is input to the IF circuitry 140 for processing, and is ultimately converted to a digital IF signal by the ADC 150. The LO frequencies may be changed continuously or by predetermined intervals in order to frequency sweep the RF input signal in a continuous or stepped manner, respectively. For purposes of discussion, the term "frequency sweeping" covers either or both continuous and stepped changes in frequency over the swept frequency range.

The digital IF signal is input to the DSP 155, which may also be referred to as an IF processor. After scaling and other adjustments by the DSP 155, IF data is provided to the host computer 160.

The host computer 160 communicates with the LO controller 135 and the DSP 155. The host computer 160 also receives input from and provides output to the user, e.g., via the display 175, through the user interface 170, enabling the user to interface with the spectrum analyzer 100. The host computer 160 is programmed to determine the LO frequencies of the LO signal, as well as the tuning speed of the LO 130 for changing the LO frequencies, to perform the frequency sweeping. Determining the tuning speed of the LO 130 may include determining intervals for stepping the LO frequencies, for example, where segments of the spectrum at each LO step may be catenated to provide the total spectrum. The host computer 160 loads the LO frequencies and tuning speed into the LO controller 135 for implementation. Alternatively, the LO controller 135 may determine the LO frequencies and/or the tuning speed itself. The LO controller 135 implements the LO frequencies and the tuning speed in order to control the frequency sweeping from the start frequency ($f_{start}$) to the stop frequency ($f_{stop}$). The LO controller 135 is able to execute the frequency sweep (continuous or stepping) faster than the CPU 160 during the measurement process. There is a direct relation between RF tuned frequency and the LO frequency, which may be referred to as the tuning equation, as would be apparent to one having ordinary skill in the art.

The host computer 160 is also programmed to determine different values of RBWs corresponding to the sensitivity (noise floor) of the spectrum analyzer 100 at different frequencies in the swept frequency range, respectively, for performing the frequency sweeping, as discussed below. The host computer 160 loads the determined RBW values into the DSP 155 for implementation. Alternatively, the DSP 155 may determine the RBW values itself. The DSP 155 implements (and may determine) the RBW values for the frequencies during the frequency sweeping, which may continue without interruption. That is, it is possible to change the value of the RBW without stopping other sweep processes, resulting in very little overhead time and maximum benefit. Generally, the narrower the RBW (lower RBW value) is for a particular frequency, the higher the signal resolution and vice versa. However, the tradeoff is that narrowing the RBW slows the sweep speed of the frequency sweeping scan since a narrower RBW results in a longer receiver response time, and thus a slower measurement. For example, the sweep speed must be slow enough to allow the RBW filter to settle. This may be problematic particularly for frequency swept measurements over a wide frequency range since overall sweep time increases.

The noise floor of the spectrum analyzer 100 is established by internally generated noise. The internally generated noise of the spectrum analyzer 100 is not always constant, but may vary according to frequency, an example of which is shown in FIG. 3A, discussed below. In conventional measurement setups using spectrum analysis, one RBW value is selected for the entire swept frequency range, where the width of the RBW is narrow enough to ensure that the RF input signal is above the noise floor of the spectrum analyzer at all frequencies. That is, due to the variable nature of the internally generated noise, the noise floor may be somewhat better than the worst-case noise floor level associated with the minimum sensitivity requirement of the measurement. In comparison, according to various embodiments, narrower RBWs are determined for frequencies corresponding to higher noise floor, and wider RBWs are determined for frequencies corresponding to lower noise floor.

Figures 4A, 4B, 4C:
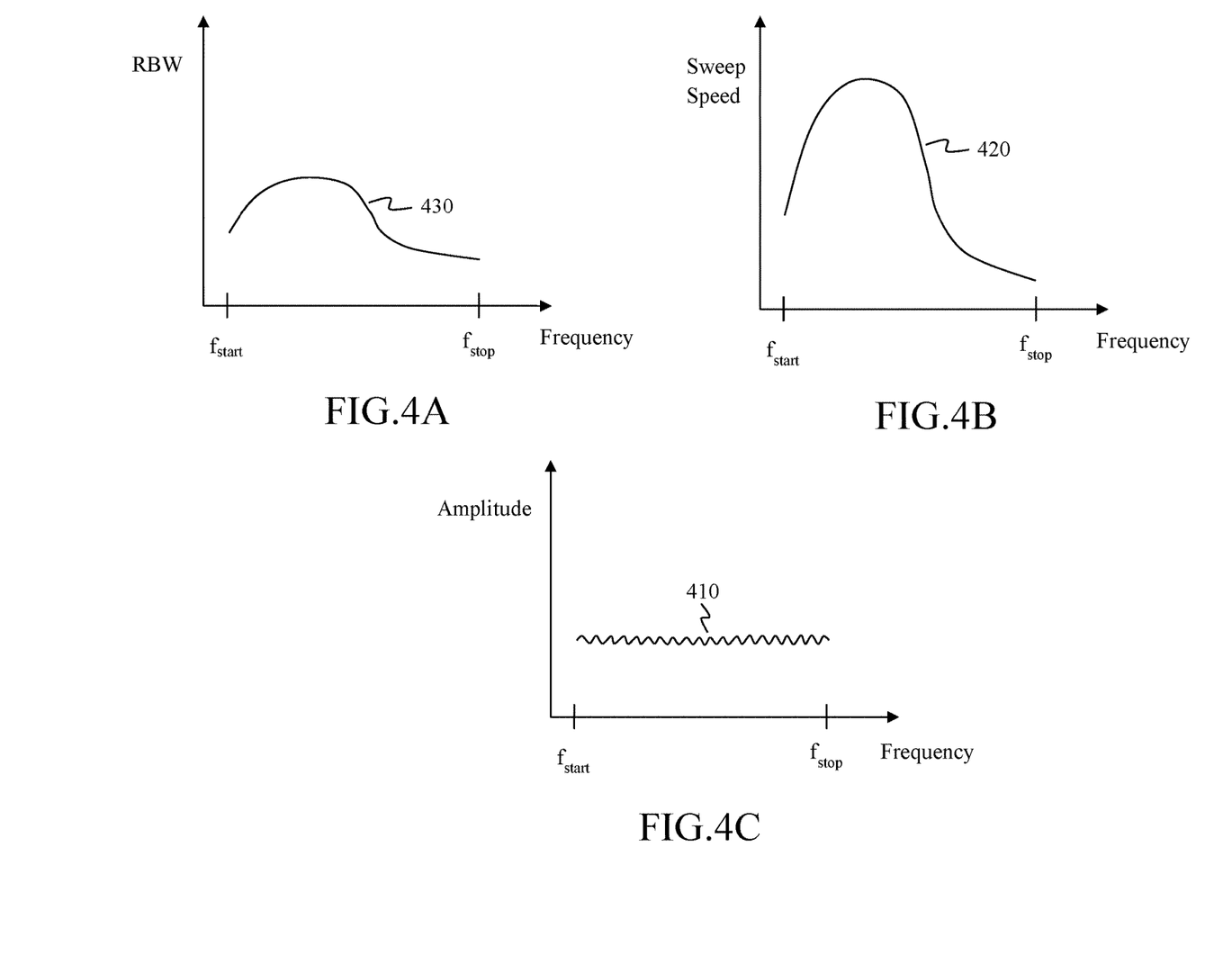
FIG. 4A is a graph showing an approximation of resolution bandwidth versus frequency in a signal measurement device, according to a representative embodiment.
FIG. 4B is a graph showing an approximation of sweep speed versus frequency in a signal measurement device, according to a representative embodiment.
FIG. 4C is a graph showing an approximation of amplitude of noise floor versus frequency in a signal measurement device, according to a representative embodiment.

More particularly, the host computer 160 (and/or the DSP 155) determines the widths of the RBWs as a function of sensitivity of the spectrum analyzer 100 at the different frequencies in the swept frequency range. That is, at frequencies where the spectrum analyzer 100 has a high noise floor (or low sensitivity), the RBW is decreased (narrower), resulting in a lower functional noise floor at those frequencies, as a practical matter, while meeting the minimum sensitivity requirement. Likewise, at frequencies where the spectrum analyzer 100 has a low noise floor (or high sensitivity), the RBW is increased (broader), resulting in a higher functional noise floor at those frequencies, as a practical matter, while still meeting the minimum sensitivity requirement. As a consequence, the functional noise floor of the spectrum analyzer 100 will be substantially constant over the full swept frequency range based on the different RBWs, an example of which is shown in FIG. 4C, discussed below. That is, implementing the determined values of the RBWs results in functional sensitivity of the spectrum analyzer 100 being substantially constant over the swept frequency range. "Substantially" in this context means within a variation in power of less than 5 dB, for example.

Also, determining and implementing different RBW values at different frequencies of the swept frequency range enables use of faster sweep speeds at frequencies where the corresponding noise floor is less than the worst case (highest) noise floor in the swept frequency range, thereby increasing overall sweep speed and decreasing over all sweep time (time required to perform one sweep from the start frequency ($f_{start}$) to the stop frequency ($f_{stop}$)). For example, increasing the RBW values at various frequencies allows for a faster sweep speed at those frequencies, since the receiver response time for broader RBWs is faster, as mentioned above. The increase in speed of the frequency sweep may be significant. For example, when a frequency region has a noise floor about 3 dB lower than a noise floor that would otherwise result from using a constant RBW, allowing the RBW to change approximately quadruples the sweep speed in this frequency region. In general, the benefit is highest for wide swept frequency ranges (e.g., more than 10 GHz) that would be expected to have the most variability in the noise floor. Also, since wide swept frequency ranges are most affected by sweep speed, the various embodiments herein are beneficial to increase improve overall sweep speed, and to decrease overall sweep time.

In order for the host computer 160 to determine the widths of the RBWs at frequencies across the swept frequency range, respectively, the inherent noise floor of the spectrum analyzer 100 must first be determined and stored in the memory 165, e.g., as a noise floor table that relates noise floor and frequency. The noise floor may be determined by the host computer 160 and/or the DSP 155, for example, based on a prior measurement without an RF input signal. Alternatively, the noise floor may be determined and stored by the manufacturer in the memory 165 as part of the calibration process of the spectrum analyzer 100. In an embodiment, the noise floor of the spectrum analyzer 100 may be determined as RMS power levels at respective frequencies, e.g., from a start frequency to a stop frequency of a swept frequency range.

In an embodiment, the user interface 170 may be configured to enable the user to manually select sweep modes. For example, the user interface 170 may provide an option to select one of a fast sweep mode, corresponding to determining and implementing values of the RBWs corresponding to the frequencies for the frequency sweeping according to various embodiments, and a normal sweep mode, corresponding to implementing a fixed resolution bandwidth and thus a fixed sweep speed.

The host computer 160, the DSP 155 and the LO controller 135 may be referred to as processing units, respectively. Also, functionality of one or more of the host computer 160, the DSP 155 and the LO controller 135 may be implemented by the same processing unit. In various embodiments each of the processing unit(s) may include one or more computer processors, field-programmable gate arrays (FPGAs), application specific integrated circuits (ASICs), or combinations thereof, using any combination of hardware, software, firmware, hard-wired logic circuits, or combinations thereof. Each of the host computer 160, the DSP 155 and/or the LO controller 135 may include its own memory (e.g., nonvolatile memory) for storing executable software/firmware executable code that enables performance of the various functions described herein. In an embodiment, a computer processor in particular may comprise a central processing unit (CPU), for example, executing an operating system.

The memory 165 accessible by the processing unit(s) may be implemented by any number, type and combination of random access memory (RAM) and read-only memory (ROM), for example, and may store various types of information, such as computer programs and software algorithms executable by one or more of the host computer 160, the DSP 155 and the LO controller 135, as well as data and/or signal storage, for example. The computer programs and software algorithms may include, for example, steps in a method of frequency sweeping an RF input signal, discussed below with reference to FIG. 2. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

Based on software knowledge of noise levels and other hardware parameters, the RBW versus sweep speed tradeoff is easily configurable. As a software defined function, the changing RBW may be provided as a user option for fast sweeps, while still supporting traditional constant RBW measurements, e.g., selectable through the user interface 170, as mentioned above.

Figure 2:
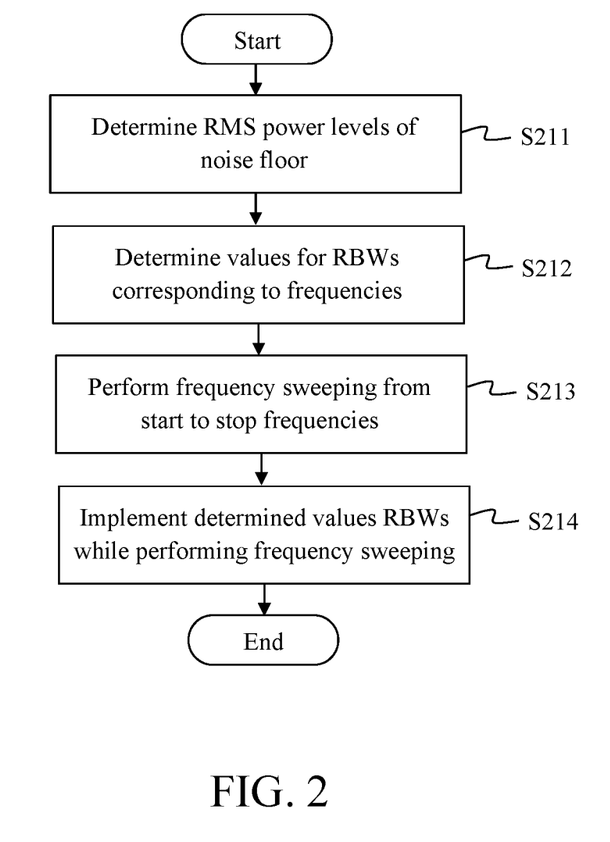
FIG. 2 is a flow diagram showing a method of receiving an RF input signal using frequency sweeping, according to a representative embodiment.

FIG. 2 is a flow diagram showing a method of frequency sweeping an RF input signal by a signal measurement device, according to a representative embodiment.

Referring to FIG. 2, RMS power levels of a noise floor in the signal measurement device (e.g., spectrum analyzer) at respective frequencies are determined at block S211. The RMS power levels are determined from a start frequency to a stop frequency of a swept frequency range, either continuously or at intervals of about 100 MHz, for example, although other intervals may be incorporated without departing from the scope of the present teachings. Determining the RMS power levels of the noise floor may include accessing previously stored noise floor RMS power levels corresponding to the respective frequencies. For example, the RMS power levels may be determined by the manufacturer during calibration of the signal measurement device. Alternatively, determining the RMS power levels of the noise floor may include performing a reference sweep of the signal measurement device over the swept frequency range using a test RBW. For example, the RMS power levels may be determined by selecting a test RBW, performing an internal (reference) sweep over the swept frequency range using the selected test RBW, and identifying the RMS power levels of the noise floor corresponding to the respective frequencies at the selected test RBW. The determined RMS power levels may be stored in memory and/or in a noise floor table that relates RMS power levels and frequency. This establishes the noise floor of the signal measurement device.

In block S212, values are determined for RBWs corresponding to the frequencies for which the RMS power levels were determined in block S211, an example of which is shown in FIG. 4A, discussed below. The determined values of the RBWs are generally inversely proportional to the RMS power levels of the noise floor at the respective frequencies. That is, where the noise floor has a low RMS power level (low noise floor), the RBW is set high to effectively raise the functional noise floor at the corresponding frequency. In contrast, where the noise floor has a high RMS power level (high noise floor), the RBW is set low to effectively lower the functional noise floor at the corresponding frequency. The purpose is to effectively level the functional noise floor (sensitivity) of the signal measurement device, an example of which is shown in FIG. 4C, discussed below. The values of the RBWs corresponding to the frequencies may be determined in steps (intervals) at discrete frequencies separated by predetermined gaps. Alternatively, the values of the RBWs corresponding to the frequencies may be determined substantially continuously over the swept frequency range. When used, the frequency intervals for determining the RBW values may be the same as or different from the frequency intervals for determining noise floor power levels, discussed above. For example, coarse frequency intervals may be used to determine the noise floor power levels, where finer frequency intervals may be used to determine the RBW values, e.g., interpolating between the noise floor frequencies.

In block S213, frequency sweeping is performed by the signal measurement device from the start frequency to the stop frequency of the swept frequency range to receive the RF input signal. The frequency sweeping may include continuous frequency changes or stepped frequency changes at predetermined intervals, for example, from the start frequency to the stop frequency, without departing from the scope of the present teachings. The determined values of the RBWs corresponding to the frequencies are implemented in block S214, e.g., by the DSP 155, while performing the frequency sweeping. The result is a functional noise floor (sensitivity) of the signal measurement device that is substantially constant over the swept frequency range. Also, implementing the determined values of the RBWs ensures that a given RF input signal can be above the noise floor irrespective of frequencies in the swept frequency range.

Using the determined values of the RBWs, at least one RBW that is greater than an RBW corresponding to a frequency in a portion of the swept frequency range that has the highest RMS power level of the noise floor, enabling an increased sweep speed over the swept frequency range. That is, the RBW at the highest RMS power level of the noise floor would be the narrowest RBW in order to increase resolution at the corresponding frequency. As stated above, narrower RBWs result in slower sweep speeds due to longer receiver response times. Therefore, at least one other RBW, corresponding to a frequency were the noise floor is lower, is wider than the narrowest RBW, enabling a faster sweep speed at that frequency. A maximum allowable sweep speed is approximately proportional to the square of the resolution bandwidth.

FIG. 3A is a graph showing amplitude of noise floor versus frequency, and FIG. 3B is a graph showing sweep speed versus frequency in a conventional signal measurement device.

Referring to FIG. 3A, curve 310 shows amplitude of a noise floor produced from a swept spectrum measurement using a fixed RBW, as in a conventional signal measurement device, and no RF input signal. In particular, curve 310 shows RMS power levels (in dB) at respective frequencies from a start frequency to a stop frequency of the swept frequency range. The noise floor varies from a low RMS power level $L_{min}$, to a high RMS power level $L_{max}$, where the sensitivity of the signal measurement device is highest at the low RMS power level $L_{min}$.

Referring to FIG. 3B, curve 320 shows the sweep speed for frequency sweeping using the fixed RBW, where the sweep speed is kept constant (sweep speed S) throughout the swept frequency range, from the start frequency $f_{start}$ to the stop frequency $f_{stop}$. The constant sweep speed S is selected to accommodate the relatively narrow RBW needed to receive an RF input signal at the frequenc(ies) corresponding to the highest RMS power level $L_{max}$ of the noise floor. That is, the constant sweep speed S must be relatively slow, as compared to sweep speeds that may be used at frequencies where wider RBWs could otherwise be implemented due to the lower noise floor (including the low RMS power level $L_{min}$).

FIG. 4A is a graph showing resolution bandwidth versus frequency, FIG. 4B is a graph showing sweep speed versus frequency, and FIG. 4C is a graph showing amplitude of noise floor versus frequency in a signal measurement device, according to a representative embodiment. More particularly, FIGS. 4A to 4C depict an embodiment in which RBW values are varied with respect to the RMS power levels of the noise floor at frequencies of the swept frequency range in order to provide a substantially constant, functional noise floor of the signal measurement device.

Referring to FIG. 4A, curve 430 shows illustrative RBW values determined for frequencies in a swept frequency range, from the start frequency $f_{start}$ to the stop frequency $f_{stop}$. Assuming the noise floor of the signal measurement device (e.g., spectrum analyzer 100) varies in a similar fashion to that shown in FIG. 3A, the values of the RBWs as shown in FIG. 4A vary in relation to the RMS power levels of the noise floor at the corresponding frequencies. That is, for frequencies having low RMS power levels (low noise floor), the RBW values are high (wide RBWs), and for frequencies having high RMS power levels (high noise floor), the RBW values are low (narrow RBWs) to provide better resolution of the signal.

Referring to FIG. 4B, curve 420 shows the sweep speeds for frequency sweeping based on the RBW values at corresponding frequencies in the swept frequency range, from the start frequency $f_{start}$ to the stop frequency $f_{stop}$. Unlike the constant sweep speed S in FIG. 3B, the sweep speeds in FIG. 4B vary with frequency as a function of the RBW values shown in FIG. 4A. For example, the sweep speed may be proportional to $RBW^2$ at the corresponding frequencies. Stated differently, the overall sweep time needed to sweep across the frequencies in the swept frequency range may be inversely proportional to $RBW^2$. Of course, other proportional relationships between the sweep speed and the RBW values may be implemented, without departing from the scope of the present teachings. As shown in FIG. 4B, the sweep speeds indicated by the curve 420 are faster for most of the frequencies in the swept frequency range than the constant sweep speed S, indicated by an arrow. Thus, according to the various embodiments, the overall sweep speed over the swept frequency range shown in FIG. 4B is faster than the overall sweep speed over the swept frequency range shown in FIG. 3B.

Referring to FIG. 4C, curve 410 shows amplitude of a functional noise floor produced from a swept spectrum measurement using the variable RBW values shown by curve 430 in FIG. 4A, and no RF input signal. In particular, curve 410 shows RMS power levels (in dB) at respective frequencies from the start frequency to the stop frequency of the swept frequency range. As shown in FIG. 4C, the functional noise floor, and thus the functional sensitivity of the signal measurement device, is substantially constant across the swept frequency range, from the start frequency $f_{start}$ to the stop frequency $f_{stop}$.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of receiving a radio frequency (RF) input signal by a signal measurement device using frequency sweeping, the method comprising:
   determining root mean square (RMS) power levels of a noise floor of the signal measurement device at respective frequencies from a start frequency to a stop frequency of a swept frequency range;
   determining values of resolution bandwidths corresponding to the frequencies, the values of the resolution bandwidths being inversely proportional to the RMS power levels of the noise floor at the respective frequencies;
   performing frequency sweeping from the start frequency to the stop frequency to receive the RF signal at the signal measurement device; and
   implementing the values of the resolution bandwidths corresponding to the frequencies while performing the frequency sweeping,
   wherein implementing the values of the resolution bandwidths results in functional sensitivity of the signal measurement device being substantially constant over the swept frequency range.

2. The method of claim 1, wherein determining the RMS power levels of the noise floor of the signal measurement device comprises accessing previously stored noise floor RMS power levels corresponding to the respective frequencies.

3. The method of claim 1, wherein determining the RMS power levels of the noise floor of the signal measurement device comprises selecting a test resolution bandwidth, performing an internal sweep over the swept frequency range using the selected test resolution bandwidth, and identifying the RMS power levels of the noise floor corresponding to the respective frequencies at the selected test resolution bandwidth.

4. The method of claim 1, wherein the values of the resolution bandwidths corresponding to the frequencies are determined in steps at discrete frequencies separated by predetermined gaps.

5. The method of claim 1, wherein the values of the resolution bandwidths corresponding to the frequencies are determined substantially continuously over the swept frequency range.

6. The method of claim 1, wherein implementing the values of the resolution bandwidths comprises automatically adjusting a local oscillator (LO) frequency of an LO in the signal measurement device while performing the frequency sweeping.

7. The method of claim 1, wherein implementing the values of the resolution bandwidths provides at least one resolution bandwidth greater than a resolution bandwidth corresponding to a frequency in a portion of the swept frequency range having a highest RMS power level of the noise floor, enabling an increased sweep speed over the swept frequency range.

8. The method of claim 1, wherein implementing the values of the resolution bandwidths ensures that the RF input signal is above the noise floor of the signal measurement device at the respective frequencies of the swept frequency range.

9. The method of claim 1, wherein a maximum allowable sweep speed is approximately proportional to the square of value of each of the resolution bandwidths, respectively.

10. A signal measurement device for measuring a spectrum of a radio frequency (RF) input signal using frequency sweeping over a swept frequency range, the signal measurement device comprising:
a tunable local oscillator (LO) configured to generate an LO signal at different LO frequencies;
a mixer configured to mix the RF input signal and the generated LO signal at the different LO frequencies to provide an intermediate frequency (IF) signal;
an analog to digital converter (ADC) configured to digitize the IF signal at periodic intervals; and
at least one processing unit programmed to:
determine power levels of a noise floor of the signal measurement device at respective frequencies from a start frequency to a stop frequency of the swept frequency range;
determine values of resolution bandwidths corresponding to the respective frequencies, the values of the resolution bandwidths being inversely proportional to the power levels of the noise floor at the respective frequencies;
compute a tuning speed of the LO, implemented by an LO controller, to control the frequency sweeping from the start frequency to the stop frequency; and
implement the values of the resolution bandwidths corresponding to the frequencies for the frequency sweeping,
wherein implementing the values of the resolution bandwidths results in functional sensitivity of the signal measurement device being substantially constant over the swept frequency range.

11. The device of claim 10, wherein computing the tuning speed of the LO comprises determining intervals for stepping the LO frequencies, and wherein segments of the spectrum at each LO step are catenated to provide the spectrum.

12. The device of claim 10, further comprising:
a user interface configured to enable a user to manually select a fast sweep mode, corresponding to implementing the values of the resolution bandwidths corresponding to the frequencies for the frequency sweeping, and a normal sweep mode, corresponding to implementing a fixed resolution bandwidth.

13. The device of claim 10, wherein the determined power levels comprise root mean square (RMS) power levels of the noise floor of the signal measurement device.

14. The device of claim 13, wherein the RMS power levels of the noise floor are determined by accessing noise floor RMS power levels corresponding to the respective frequencies previously stored in memory.

15. The device of claim 13, wherein the RMS power levels of the noise floor are determined by selecting a test resolution bandwidth, performing an internal sweep over the swept frequency range using the selected test resolution bandwidth, and identifying the RMS power levels of the noise floor corresponding to the respective frequencies at the selected test resolution bandwidth.

16. The device of claim 10, wherein the values of the resolution bandwidths corresponding to the respective frequencies are determined in steps at discrete frequencies separated by predetermined gaps.

17. The device of claim 10, wherein the values of the resolution bandwidths corresponding to the respective frequencies are determined substantially continuously over the swept frequency range.

18. A non-transitory computer-readable storage medium that stores instructions for measuring a received radio frequency (RF) input signal, which when executed by at least one processor, cause the at least one processor to perform a method comprising:
determining root mean square (RMS) power levels of a noise floor of a spectrum analyzer at respective frequencies for frequency sweeping from a start frequency to a stop frequency of a swept frequency range, the spectrum analyzer comprising a local oscillator (LO) for generating an LO signal at different LO frequencies and a mixer for mixing the LO signal and the RF input signal;
determining values of resolution bandwidths corresponding to the respective frequencies, the values of the resolution bandwidths being inversely proportional to the RMS power levels of the noise floor at the respective frequencies;
computing a tuning speed of the LO to control the frequency sweeping from the start frequency to the stop frequency; and
implementing the values of the resolution bandwidths corresponding to the frequencies for the frequency sweeping in order to provide functional sensitivity of the spectrum analyzer that is substantially constant over the swept frequency range.

19. The computer-readable storage medium of claim 18 storing instructions, which when executed by the at least one processor, cause the at least one processor to perform a method further comprising determining the values of the resolution bandwidths corresponding to the respective frequencies in steps at discrete frequencies separated by predetermined gaps.

20. The computer-readable storage medium of claim 18 storing instructions, which when executed by the at least one processor, cause the at least one processor to perform a method further comprising determining the values of the resolution bandwidths corresponding to the respective frequencies substantially continuously over the swept frequency range.

* * * * *